(12) United States Patent
Yamashita et al.

(10) Patent No.: US 6,462,556 B2
(45) Date of Patent: Oct. 8, 2002

(54) CIRCUIT BOARD TESTING APPARATUS AND METHOD

(75) Inventors: Munehiro Yamashita, Uji (JP); Michio Kaida, Uji (JP)

(73) Assignee: Nidec-Read Corporation, Uji (JP)

( * ) Notice: Subject to any disclaimer, the term of this patent is extended or adjusted under 35 U.S.C. 154(b) by 0 days.

(21) Appl. No.: 09/822,755

(22) Filed: Mar. 30, 2001

(65) Prior Publication Data

US 2001/0013783 A1 Aug. 16, 2001

Related U.S. Application Data

(63) Continuation of application No. 09/176,248, filed on Oct. 21, 1998, now abandoned.

(30) Foreign Application Priority Data

Oct. 30, 1997 (JP) ............................................. 9-298316

(51) Int. Cl.⁷ ............................................. H01H 31/02
(52) U.S. Cl. ..................................................... 324/537
(58) Field of Search ................................ 324/537, 754, 324/755, 760, 765; 439/66, 68, 71, 482

(56) References Cited

U.S. PATENT DOCUMENTS 5,006,788 A  *  4/1991  Goulette et al. ............... 324/95
5,469,064 A  * 11/1995  Kerschner et al. .......... 324/537

* cited by examiner

Primary Examiner—N. Le
Assistant Examiner—Etienne P LeRoux
(74) Attorney, Agent, or Firm—McCormick, Paulding & Huber LLP

(57) ABSTRACT

A probe is made to contact one end of the test wiring of a circuit board 32, with a head 52 electrostatically coupled to the other end of said wiring. A pulse-like DC voltage is supplied from a signal source 46, and, simultaneously with a switch section SWp turning on, the maximum voltage is applied to the test wiring. If a detection signal is below a specified value, then a computer 44 will read it as "open" or "shorting". Further, a tip 52*a* of the head 52 is associated with the circuit board 32 only through an insulating sheet 33, so that the tip 52*a* is kept away from each pad of a pad section 38 on the board at a fixed distance (equivalent to the thickness of insulating sheet 33). Thus, continuity testing may be performed in a non-contact manner by moving head 52 only in X and Y directions without movement in the Z-direction.

16 Claims, 8 Drawing Sheets

CIRCUIT BOARD TESTING APPARATUS AND METHOD

This is a continuation of application Ser. No. 09/176,248, filed Oct. 21, 1998, now abandoned.

FIELD OF THE INVENTION

The present invention relates to a circuit board testing apparatus and method and in particular, to a wiring test using electrostatic capacity.

PRIOR ART

In Japanese Patent Application Laid Open No. 4-248477, a printed circuit board testing apparatus using a flying probe is disclosed. Such a testing apparatus is equipped with X- and Y-axis servo sections that drive an X-Y table on which a circuit board to be tested is mounted. A Z-axis servo section drives a probe head. To be more specific, the testing apparatus operates to test a desired pattern for continuity and shorts by moving the X-Y table so that the probe head is positioned on the pad section of the pattern, as well as by driving the Z-axis servo section so that the probe head contacts the pattern. When the pattern has been tested, the Z-axis servo section allows the probe head to leave the pattern, followed by moving the X-Y table so that the probe head is positioned on the pad section of a pattern to be subsequently tested. The foregoing enables circuit boards of any kind to be tested by changing only the position of the pad section. In testing apparatus of this type, however, the following problems are encountered.

To move the probe head from one pad to another, the X-Y table cannot be moved unless the probe head is kept away from a contacted pad. Therefore, supposing that one printed pattern requires several milliseconds of time or so for the Z-axis transfer and that several thousands of tests are conducted for a single circuit board, this means that several tens of seconds or so will be required for the Z-axis transfer of a single circuit board.

Furthermore, allowing the probe head tip to contact the pad section may result in scars on the pad section. Because a finely pitched pad section in particular is small in size, it suffers a greater adverse effect of such scars.

Accordingly, it is an object of the present invention to provide a printed circuit board testing apparatus and method which makes it possible to solve the problems mentioned above and to test wiring quickly without causing damage thereto.

SUMMARY OF THE PRESENT INVENTION

In fulfillment of the foregoing object, a circuit board testing apparatus is provided with a first terminal that is to be coupled in a non-contact manner to either end of test wiring of a printed circuit board to be tested, a means that transfers said first terminal over the surface on which test wiring of said circuit board is to be carried out, while maintaining said non-contact condition, means that supplies a test signal to the other end of said non-contact coupled test wiring, and a means for determining test wiring of a circuit board to be tested for continuity and shorts based on a signal that is detected from said non-contact coupled test wiring.

The foregoing of course eliminates the need to move the first terminal toward and away from the circuit board surface, thus reducing testing time. Furthermore, since the terminal at one end can be determined for continuity and shorts in a non-contact manner, there is no risk of flaws on said terminal.

Further, an insulating sheet is provided between said first terminal and said circuit board to be tested and is preferably made of a material which provides excellent sliding characteristics.

Still further, a circuit board testing apparatus is provided with a first terminal shaped to provide excellent sliding characteristics over said insulating sheet.

The test signal has a rapid change characteristic and the determination means monitors the wiring for continuity based on the maximum current generated between said test wiring and said first terminal after a rapid change has occurred in said test signal. The maximum current is generated almost simultaneously with the occurrence of the rapid change in the signal allowing one to know the continuity condition of the test wiring in an extremely short period of time.

When testing a circuit board has been completed for continuity and short determination, the first terminal is transferred over the surface on which the test wiring is formed while it is kept away at a distance which allows non-contact coupling with said circuit board, and is followed by coupling one end of subsequent test wiring with said first terminal in a non-contact manner. A test signal is supplied to the test wiring that is coupled with said first terminal in a non-contact manner and test wiring of the circuit board is determined for continuity and shorts based on the signal detected at said first terminal.

Terms used in this specification are described below:

The term "circuit board" refers to a base material on which wiring can be or has been formed, and is not limited in terms of its material, structure, shape, or size. It includes, for example, glass epoxy substrates and film-like substrates as well as packages on which circuit elements such as CPUs are to be mounted. It further includes composite substrates wherein sockets are mounted on a glass epoxy substrate and substrates on which circuit elements are mounted.

The term "wiring" refers to an electrical conductor and is not limited in terms of its material, structure, shape, or size. It includes conductive parts of printed patterns, through-holes, and pins formed in circuit boards, as well as conductive parts of electric cords, sockets, connectors, and pins attached to the circuit board.

The terms "one end of the wiring" and "the other end of the wiring" refer to the points of the wiring to and from which signals for tests are input and output, there is no limitation in terms of material, structure, shape, or size. Included are the sections that form points of electrical contact with other parts, as found in printed pattern testing ends, connector connecting ends, connecting pins, pads for connecting bonding wires, pads for connecting circuit elements or sockets, insertion portions provided in sockets attached to circuit boards, and the input and output terminals of connectors, and also arbitrary locations in the wiring.

The term "non-contact coupling" refers to the coupling of two or more members in such a way that they can transmit and receive signals to and from one another while remaining insulated from one another. In the present invention, this corresponds to electrostatic coupling that uses electrostatic capacity, but is not so limited.

The term "signal" refers to a signal used for testing. This concept includes both voltage and current. Besides AC signals such as sine waves, it includes DC signals, rectangular and triangular signals, and pulse-like signals.

The expression "based on the signal detected from the non-contact coupled test wire" means that something is based on said detection signal itself or a physical quantity corresponding or relating to said signal. Thus, it includes not only a voltage signal but also, for example, a current corresponding or relating to said voltage, as well as integral and differential values thereof.

The term "detection of continuity of the wiring" includes the detection of an open or short circuit of the wiring, and the detection of the resistance value of the wiring such as the detection of a half-open-circuit.

The term "signal with a rapid change" refers to a signal with a large amount of variation in voltage or current per unit time, and includes, for example, DC signals with a step-like rising or falling edge, triangular and rectangular signals, and pulse-like signals.

DESCRIPTION OF THE PREFERRED EMBODIMENTS

Figure 1:
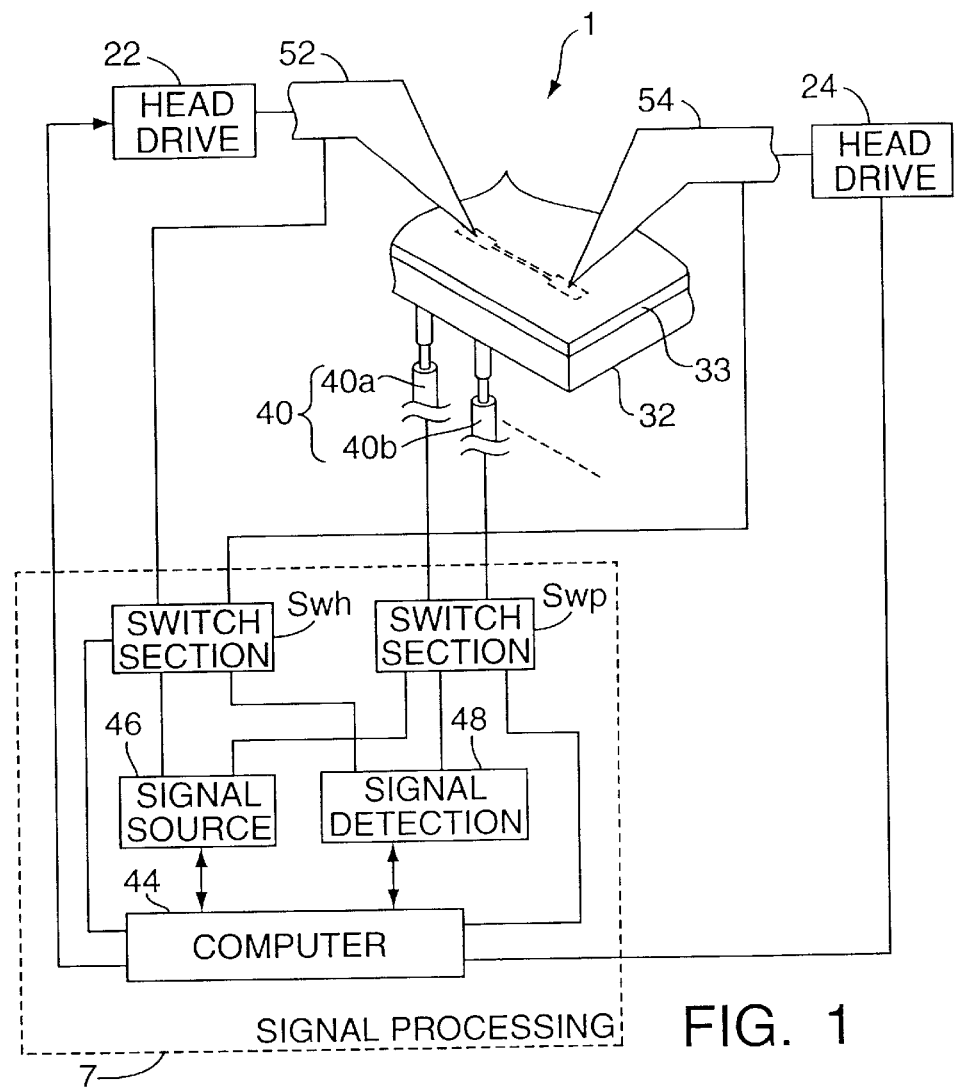
FIG. 1 is a schematic drawing showing a bare board tester 1 as one embodiment of the present invention.

FIG. 1 shows a functional block diagram of a bare board tester 1 as a circuit board testing apparatus which utilizes electrostatic capacity. That is, the apparatus of FIG. 1 tests the continuity of a printed pattern on a printed circuit board (a bare board) on which no circuit elements have yet been mounted.

The tester comprises a signal processing section 7, a probe section 40, head drive sections 22, 24, and heads 52, 54. The signal processing section 7 has switch sections SWp and SWh, a signal source 46, a signal detecting section 48, and a computer 44.

As will be discussed later, the heads 52, 54 are respectively moved over surface of the circuit board 32 by means of the head drive sections 22, 24. A test signal output from the signal source 46 is sent to the desired test wiring by the switch sections SWh, SWp. Furthermore, the test signal sent to such test wiring is detected, at the head 52, head 54 or the selected probe, by means of the switch sections SWh, SWp. The signal thus detected is subjected to specified processing at the signal detecting section 48 shown in FIG. 1, after which said signal is sent to the computer 44, which in turn determines each of the printed patterns that have been selected by the switch sections SWp, SWh, for continuity and short testing based on the signal received.

A printed circuit board to be tested will now be described with reference to FIG. 2. As shown, a printed circuit board 32 has a printed pattern and pads at one end on the front surface, with pads at the other end on the back surface.

On the surface of the circuit board 32 are formed a plurality of printed patterns 34a, 34b, . . . as test wiring. The plurality of printed patterns 34a, 34b, . . . are collectively referred to as a printed pattern section 34. Pads 36a, 36b, . . . are formed on the back surface of the circuit board 32 at one end of the printed patterns 34a, 34b, . . . , respectively. The pads 36a, 36b, . . . are collectively referred to as a pad section 36. The pad section 36 is configured to be in a rough pattern to an extent that contact is attained with the probe section 40 to be described later. At the other end of each of the printed patterns 34a, 34b, . . . are formed pads 38a, 38b, . . . respectively, which are collectively referred to as a pad section 38. Because an IC chip is to be mounted on the pad section 38, the pitch at which each of the adjacent pads 38a, 38b, . . . is disposed is very small (finely pitched for high density).

A probe and a non-contact head will now be described. A bare board tester 1 shown in FIG. 1 comprises a plurality of probes 40a, 40b, . . . that are electrically connected to the pads 36a, 36b, . . . of the circuit board 32. The plurality of probes 40a, 40b, . . . are collectively referred to as a probe section 40. To the probe section 40 is connected the switch section SWp as the first switching means. The switch section SWp is switched over in accordance with commands from the computer 44 to thereby select the probe to be connected to the signal source 46 or the signal detecting section 48.

On each pad of the pad section 38 on the circuit board 32 are provided heads 52, 54 that can move in the X and Y directions in accordance with a "move" command from the computer 44 so that they are positioned on the desired pads. The heads 52, 54 will be described below with reference to FIGS. 3 and 4.

Figure 3:
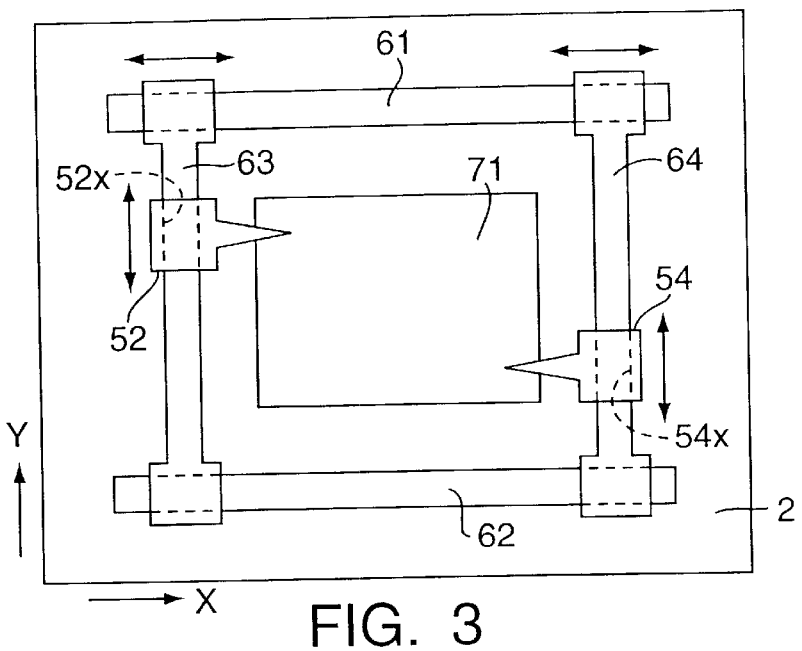
FIG. 3 is a plan view illustrating the structure of a head.
Figure 4:
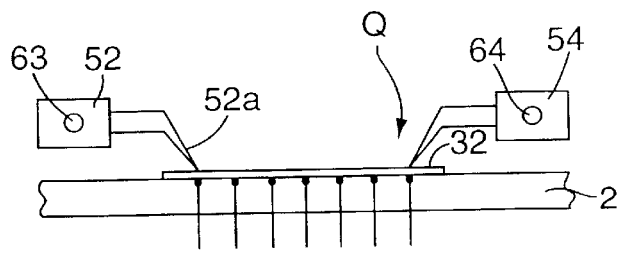
FIG. 4 is a side view illustrating the structure of the head.

As shown in FIGS. 3 and 4, a through-hole 52X is formed in the head 52 to allow a shaft 63 to pass therethrough. Thus, the head 52 can move in the Y direction along the shaft 63 or in the reverse direction by means of the head drive section 22 shown in FIG. 1. Through-holes are also formed in the shaft 63 to allow the shafts 61, 62 to pass therethrough, by which the head 52 can also move in the X direction along the shafts 61, 62 or in the reverse direction. Thus, the head 52 can be positioned on a desired pad within a test area 71.

Likewise, the head 54 can move in the Y direction along the shaft 64 or in the reverse direction. The shaft can also move in the X direction along the shafts 61, 62 or in the reverse direction.

As shown in FIG. 4, a tip 52a of the head 52 is positioned on the pad of the test circuit board 32 mounted on a circuit board holding plate 2. The surface of the circuit board 32 is covered with an insulating sheet 33, FIG. 5, which the tip 52a engages. This allows a certain distance (equivalent to the thickness of the insulating sheet) to be maintained between each pad in the section 38 on the circuit board 32 and the tip 52a. Therefore, the relationship for a fixed capacity of electrostatic coupling is established even when the head 52 is moved in the X and Y directions.

Figure 5A:
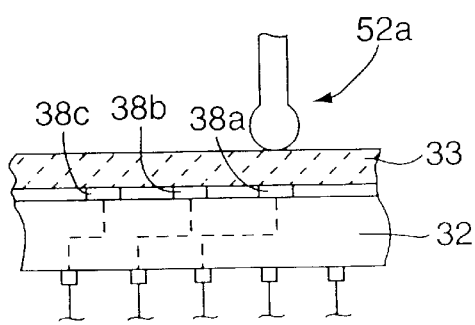
FIG. 5A is an enlarged view taken at Section Q in FIG. 4.
Figure 5B:
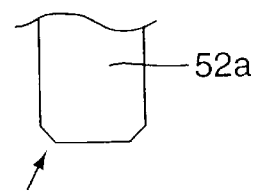
FIG. 5B shows another tip shape.
Figure 5C:
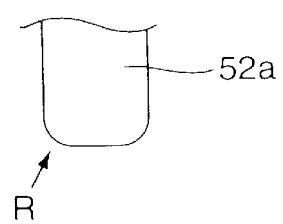
FIG. 5C shows still another tip shape.

The insulating sheet 33 is made of a material which allows the tip 52a of the head 52 to easily slide. Making the shape of the tip 52a spherical also aids in accommodating smooth movement of the head 52 in the X and Y directions. The head shape is, however, not limited to a "spherical" configuration, and any shape is acceptable as long as smooth movement of the head 52 is attained in the X and Y directions. For example, a chamfered tip or a rounded tip as shown in FIGS. 5B and 5C, respectively, may be employed.

Further, in this embodiment the heads 52, 54 each correspond to a first terminal, and the probes 40a, 40b, . . . respectively to a second terminal. The probes 40a, 40b, . . . contact the other end of test wiring coupled in a non-contact manner, and supply a test signal.

Figure 6:
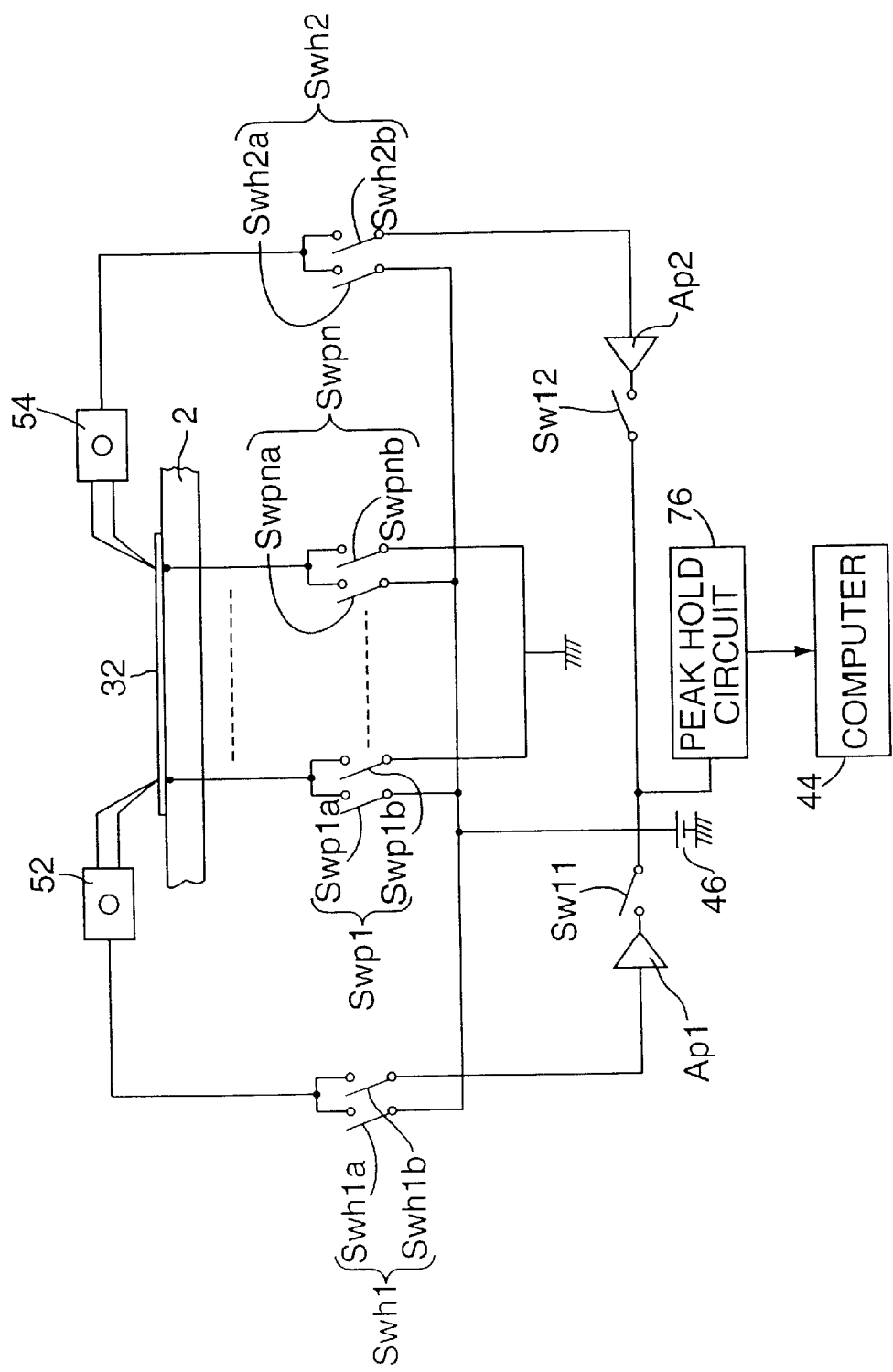
FIG. 6 shows the circuit configuration which explains signal processing.

In FIG. 6, the switch section SWp which switches probe section 40 comprises a plurality of switches SWp1, SWp2, . . . Each switch is turned on and off by command from the computer 44 as shown in FIG. 1, and transmits the signal given by the signal source 46 to the desired probe of the probe section 40. Further, the switch SWp1a is a selector switch for a power supply, and the switch SWp1b is a selector switch on the return side.

The head 52 is switched over to change the state of connection by means of the switch sections SWh1 and SW11. The switch SWh1a is a selector switch for power supply, and the switch SWh1b a switch for connecting to an amplifier, Ap1, Ap2. Furthermore, the switch SW11 is a switch used to select an amplifier Ap1, Ap2 to be connected to peak hold circuit 76.

Figure 2:
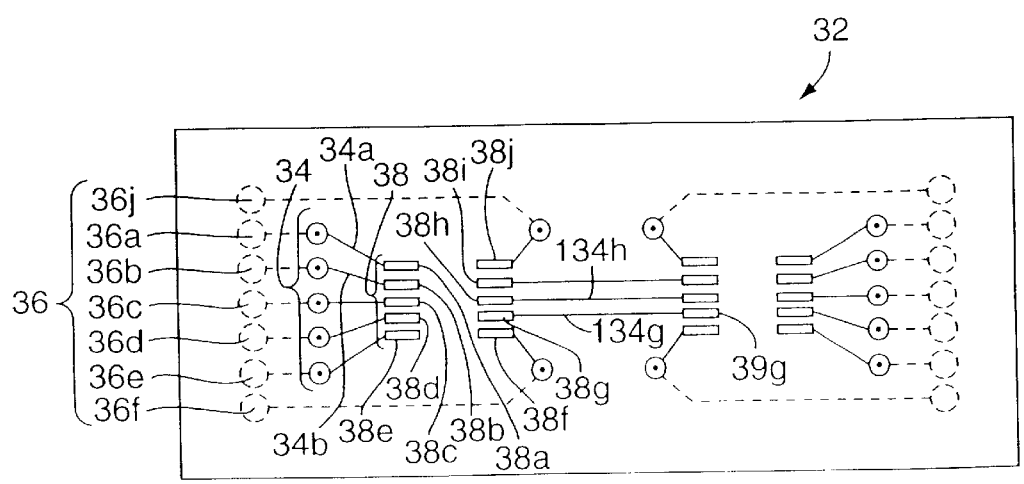
FIG. 2 is a plan view illustrating a circuit board to be tested.

To check the pattern 34a, for example, shown in FIG. 2, for continuity, each of the switches is switched over. Here, it is assumed that the switch in contact with the end pad 36a of the pattern 34a is the switch SWp1 shown in FIG. 6. First, turn on switch SWh1b of the switch SWh1, and turn off the switch SWh1a. Further, turn on the switch SW11, then the switch SWp1a, source 46, to the pad 36a, and the signal detected at the head 52 to the amplifier Ap1.

As with the head 52, the head 54 can be switched over to change the state of connection by means of the switch sections SWh2 and SW12.

Still further, when checking the pattern 134g shown in FIG. 2 for continuity, a continuity test may be conducted between the heads 52, 54. Thus, apply the signal given from the signal source 46 to the head 54, to the pad 39g, and switch over the switches SWh1, SWh2 shown in FIG. 6 in such a manner that said signal can be detected at the head 52. This may be achieved, for example, by turning on the switch SWh1b of the switch SWh1, turning off the switch SWh1a, turning on the switch SW11, turning off the switch SWh2b of the switch SWh2, then turning on the switch SWh2a in this sequence.

Conversely, one may turn on the switch SWh2b of the switch SWh2, turn off the switch SWh2a then turn off the switch SWh1b of the switch SWh1, turn on the switch SWh1a and turn on the switch SW12 in this order.

When checking the pattern 34a and the pattern 34b shown in FIG. 2 for shorting, a shorting test may be carried out between the pad 36a and the pad 36b. Thus, apply the signal given from signal source 46 to the pad 36a to thereby provide a grounding potential to pad 36b. In other words, if the switch in contact with the pad 36a is for example the switch SWp1 shown in FIG. 6, then one should turn on the switch SWp1a and turn off the switch SWp1b. If the switch in contact with the pad 36b is the switch SWp2 shown in FIG. 6, then one may turn off the switch SWp2a, and turn on the switch SWp1b.

When the patterns 134g and 134h shown in FIG. 2 are to be checked for shorting, a shorting test may be conducted between the heads 52, 54. Thus, for example, apply the signal from source 46 to the head 54, to the pad 134g, and switch over the switches SWh1, SWh2 shown in FIG. 6 so that shorting can be detected from the head 52. In this case, one should turn on the switch SWh1b of the switch SWh1, turn off the switch SWh1a, turn on the switch SW11, turn off the switch SWh2b of the switch SWh2, then turn on the switch SWh2a in this sequence.

Signal processing carried out by signal source 46 and the signal detecting section 48 shown in FIG. 1, is described here on the basis that the pad 36a contacts the switch SWp1, the pad 36b the switch SWp2, the pad 36c the switch SWp3 and so on in the same manner (said pads being shown in FIG. 2), with the head 52 moved to the pads 38a, 38b, 38c . . . one by one to sequentially check the patterns 34a, 34b, 34c . . . for continuity.

Figure 7:
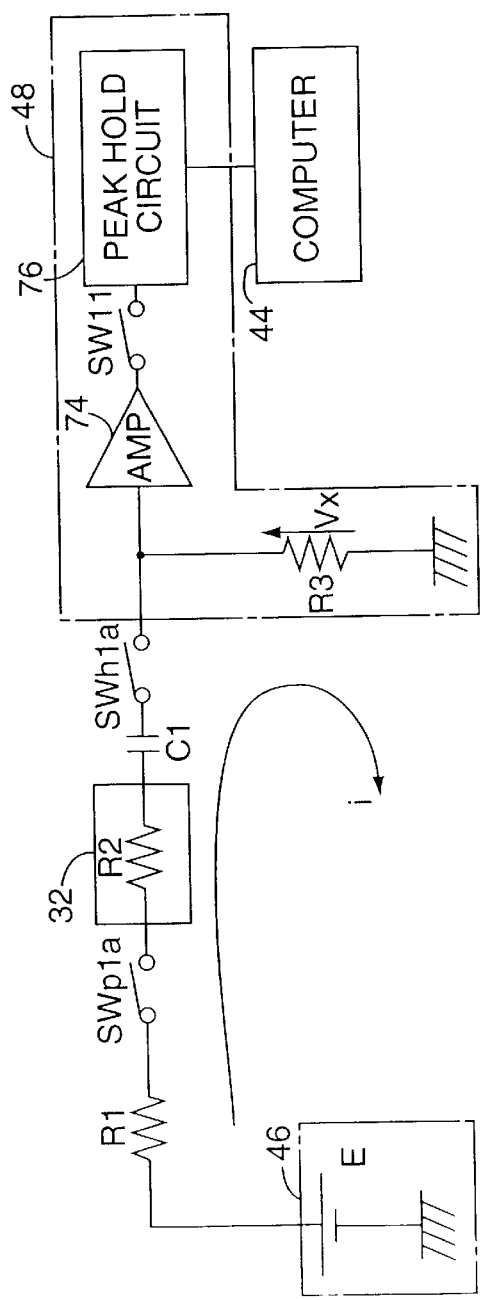
FIG. 7 is a view showing an equivalent circuit for use to describe the signal processing.

First, the computer 44 issues a drive command to the head drive 22 shown in FIG. 1, to position the head 52 on the pad 38a. This allows the head 52 to touch the insulating sheet 33 and move onto the pad 38a, thus making it possible for the head 52 to be electrostatically coupled to the pad 38a. As a result, an equivalent circuit as shown in FIG. 7 will be formed, wherein a resistor R1 represents the inner resistance of the switches SWp1a and SWh1b, and a resistor R2 the resistance of the printed pattern 34a on the circuit board 32, and a resistor R3 the grounding resistance of the signal detecting section 48, respectively. C1 represents a capacitor formed by the tip 52a of the head 52, the insulating sheet 33 (FIG. 5) and the pad 38a (FIG. 5). Constant-voltage E represents a DC voltage of the signal source 46.

Figure 8:
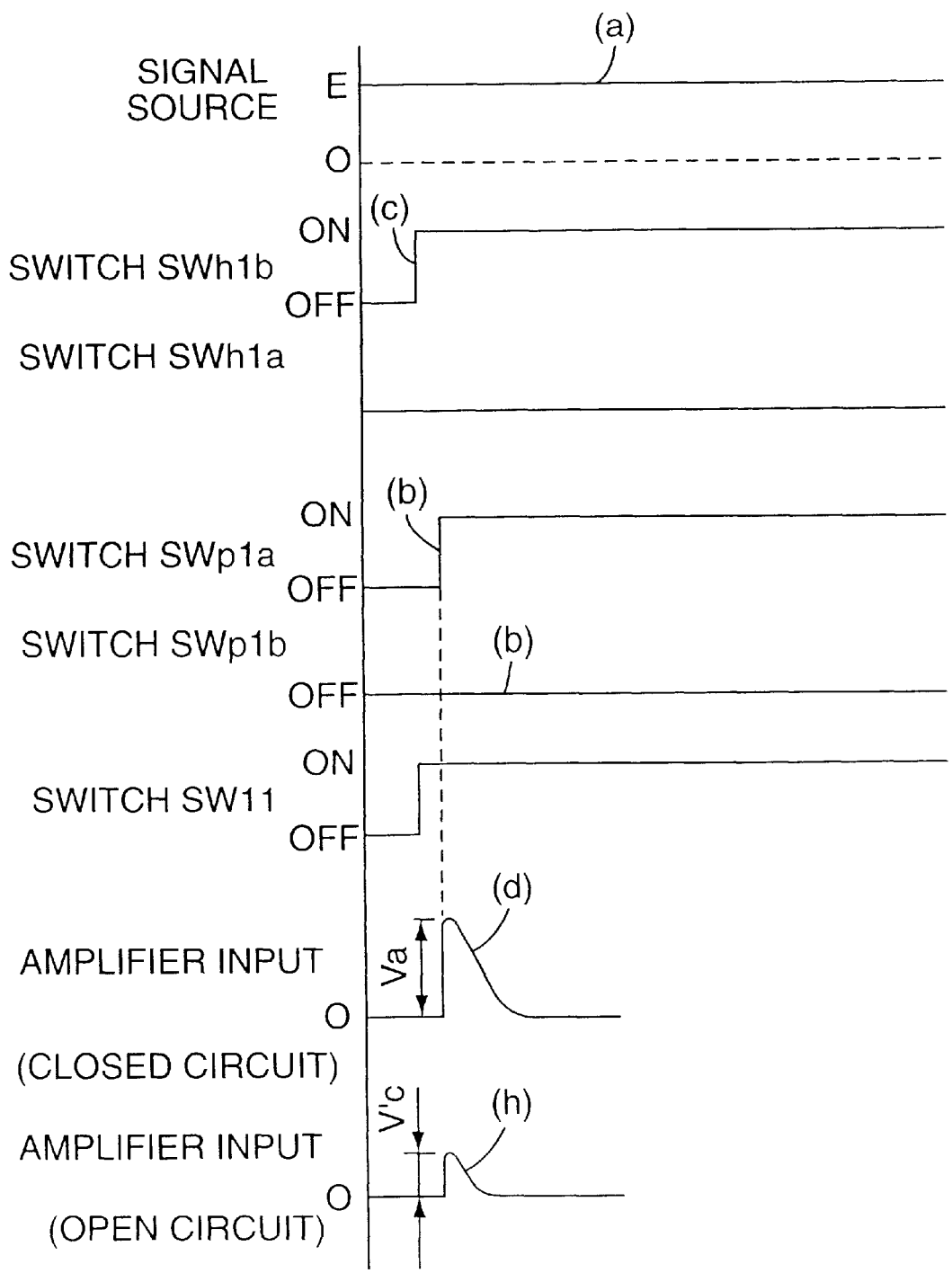
FIG. 8 is a timing chart for signal processing.

With reference to FIG. 8, the switching-over timing of switches at the time of signal processing will be described. Some of the switches configuring the switch sections SWp, SWh are left out for simplification of the description.

In this embodiment, a constant-voltage source is used as a signal source 46. Therefore, constant-voltage E is applied to switch section SWp shown in FIG. 7 from the signal source 46, FIG. 8(a). The computer 44 transmits commands to the switch section SWh1 to turn on the switch SWh1b, FIG. 8(c), turn off the switch SWh1a, and turn on the switch SW11 respectively. Computer 44 further transmits commands to the switch section SWp to thereby turn on the switch SWp1a and turn off the switch SWp1b, FIGS. 6 and 8(b) accordingly.

With switch SWp1a turned on, FIG. 8(b), the equivalent circuit shown in FIG. 7 closes, causing the following current i to flow.

$$i=\{E/(R1+R2+R3)\}\exp(-at) \quad (1)$$

where:

$$a=1/\{(R1+R2+R3)C1\} \quad (2)$$

Therefore, the input voltage Vx to the amplifier 74 is expressed by the following equation (3).

$$Vx=R3 \cdot i \quad (3)$$

From Equations (1) and (3), the input voltage Vx to the amplifier 74 is expressed by the following equation (4).

$$Vx=\{R3 \cdot E/(R1+R2+R3)\}\exp(-at) \quad (4)$$

where:

$$a=1/\{(R1+R2+R3)C1\}$$

The voltage Vx is amplified by the amplifier 74, and its maximum value (corresponding to the voltage Va in FIG.

8,($d$)) is then detected and held by peak hold circuit 76. The peak hold circuit 76 is equipped with a D/A converter (not shown), and the digitized maximum value is transmitted to the computer 44. Further, it will be apparent that some of the functions of the peak hold circuit 76 can also be realized using the computer 44.

Based on the maximum value the computer 44 determines the printed pattern 34$a$ of the circuit board 32 for continuity. As seen from Equation (4), the input voltage Vx to the amplifier 74 exhibits the maximum voltage Va (=R3·E / (R1+R2+R3)) immediately after the switch SWp1$a$ is turned on (see FIG. 8,($d$)).

If the printed pattern 34$a$ is found not open-circuited, then the input voltage Vx to the amplifier 74 will be the normal value as shown in FIG. 8($d$). On the other hand, when the printed pattern 34$a$ is open-circuited, the input voltage Vx to the amplifier 74 for the printed pattern 34$a$ will be as shown in FIG. 8($h$), resulting in the maximum value V'c being quite small. This can also be understood from the fact that when, in Equation (2), R2 that represents the printed pattern resistance is infinitized (for completely open circuit), "Vx= 0" will always result irrespective of time t.

Thus, a printed pattern can be easily tested for an open circuit depending on whether or not the maximum value is between preset lower and upper reference values. Thus, detection processing of the maximum value by the peak hold circuit 76 may be completed in an extremely short period of time and determination processing of a complete printed pattern for continuity can also be conducted in an extremely short period of time. As a result, the detection signal is less likely to be subject to humming or other noise.

In the same manner as above, computer 44 follows the testing program and continues to perform continuity tests on the printed patterns 34$b$, 34$c$, . . . while moving the head 52 and switching over the respective switches of the switch sections SWp and SWh1 as appropriate.

Further, when testing the printed pattern 34$b$, the switch SWp1$a$ may be either turned off or on.

Still further, in this embodiment, and as described above, the head 52 is electrostatically coupled to the group of pads 38$a$, $b$ . . . by each independent capacitor. Therefore, the electrostatic capacity of an individual capacitor C1 becomes comparatively small. In other words, a shown in Equation (1) becomes a relatively large value (namely, the time constant becomes small). This in turn reduces the time t required for the current i to be nearly zero, allowing the determination processing of printed patterns for continuity to be done in an even shorter cycle.

Thus, in this embodiment the heads 52, 54 can be moved in the X and Y directions while maintaining a non-contact condition by means of insulating sheet 33. The heads 52, 54 can not be moved toward the circuit board (i.e., in the Z direction) and this enables printed patterns to be tested for continuity in a fast and yet precise manner.

An expensive and finely pitched probe is thus not required even for a circuit board on which wiring to be tested is densely disposed at one end thereof, and no possibility of scratching one end of the wiring is created.

The wiring is detected for continuity based on the voltage generated at the first terminal coupled to the end of the wiring opposite the one end of the wiring connected or coupled. Thus, the wiring can be detected for continuity irrespective of a broken-wire or mutual wire shorting.

Because the specified signal has a rapid change, the voltage generated at the first terminal when said signal is sent also changes rapidly in response to the change in said signal. Therefore, detecting the rapid change makes it possible to determine the wiring for continuity, thus achieving fast testing. As a result, the detection signal is less subject to humming and other undesirable noise.

Coupling the first terminal to one end of the wiring and the second terminal to the other end of said wiring both in a non-contact manner also considerably reduces the coupling capacity as compared with coupling only the first terminal to the wiring in a non-contact manner. This in turn reduces the time constant of the circuit to which a signal current runs at the time of testing, allowing the testing time to be further reduced.

As will be apparent from the foregoing, the present invention accommodates an inexpensive and yet highly reliable test to be carried out in a short period of time even on a densely wired circuit board.

In the foregoing apparatus to which this embodiment of the present invention applies, the heads 52, 54 move in parallel in the X and Y directions to their desired positions. However, the present invention is not limited in this respect, and any drive capable of moving the heads to the desired positions is acceptable. For example, an apparatus in which the head(s) move to the desired position(s) by rotating on the X-Y plane about the axis may be acceptable.

Further, this embodiment can also be configured in such a manner that the switch SWp1$a$ is turned off immediately after the maximum value detection processing (processing for detecting the maximum value corresponding to the voltage Va) of the printed pattern 34$a$ by the peak hold circuit 76 is completed, and the head 52 moved, followed by the switch SWp2$a$ being turned on. Configuring said embodiment in this manner makes it possible to move on to test a next printed pattern 34$b$ without waiting for the current i to the printed pattern 34$a$ to approach zero. Consequently, this allows a printed pattern to be tested for continuity in an even shorter cycle. Furthermore, with this configuration implemented the test cycle will never be extremely long even if the time constant (reciprocal number of a in Equations (1), (2)) is large.

In addition to the foregoing, this embodiment has been described in conjunction with a signal having a rapid change as a specified signal for use in testing. However, the present invention is not limited in this regard. As a specified signal for use in testing, one can also use an AC signal such as a sinusoidal wave alternating current.

Figure 9:
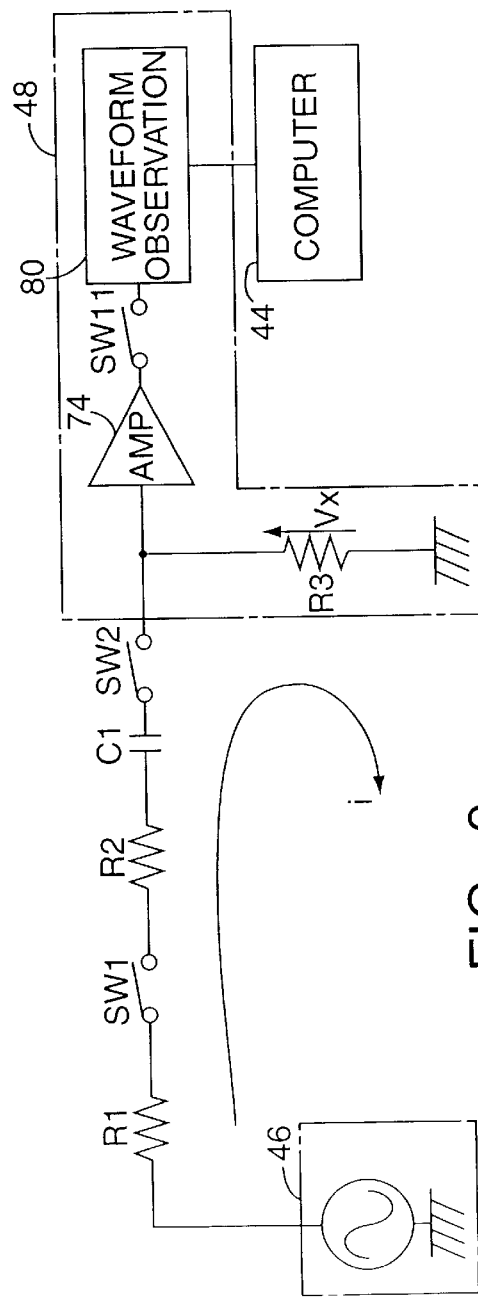
FIG. 9 shows an equivalent circuit which employs a sinusoidal wave AC measuring circuit.

When using an AC signal as a specified signal, a sinusoidal wave oscillator, for example, as shown in FIG. 9 may be used as a signal source 46. Assume a sinusoidal wave having a frequency of some 10 kHz generated at the signal source 46 and a signal detecting section 48 including a waveform observation circuit 80 in place of the peak hold circuit 76 shown in FIG. 7. The waveform observation circuit 80 is a circuit which processes an input signal and evaluates the signal level and the waveform thereof. More specifically, a wave detection circuit and an oscilloscope may be used for this purpose.

Figure 10:
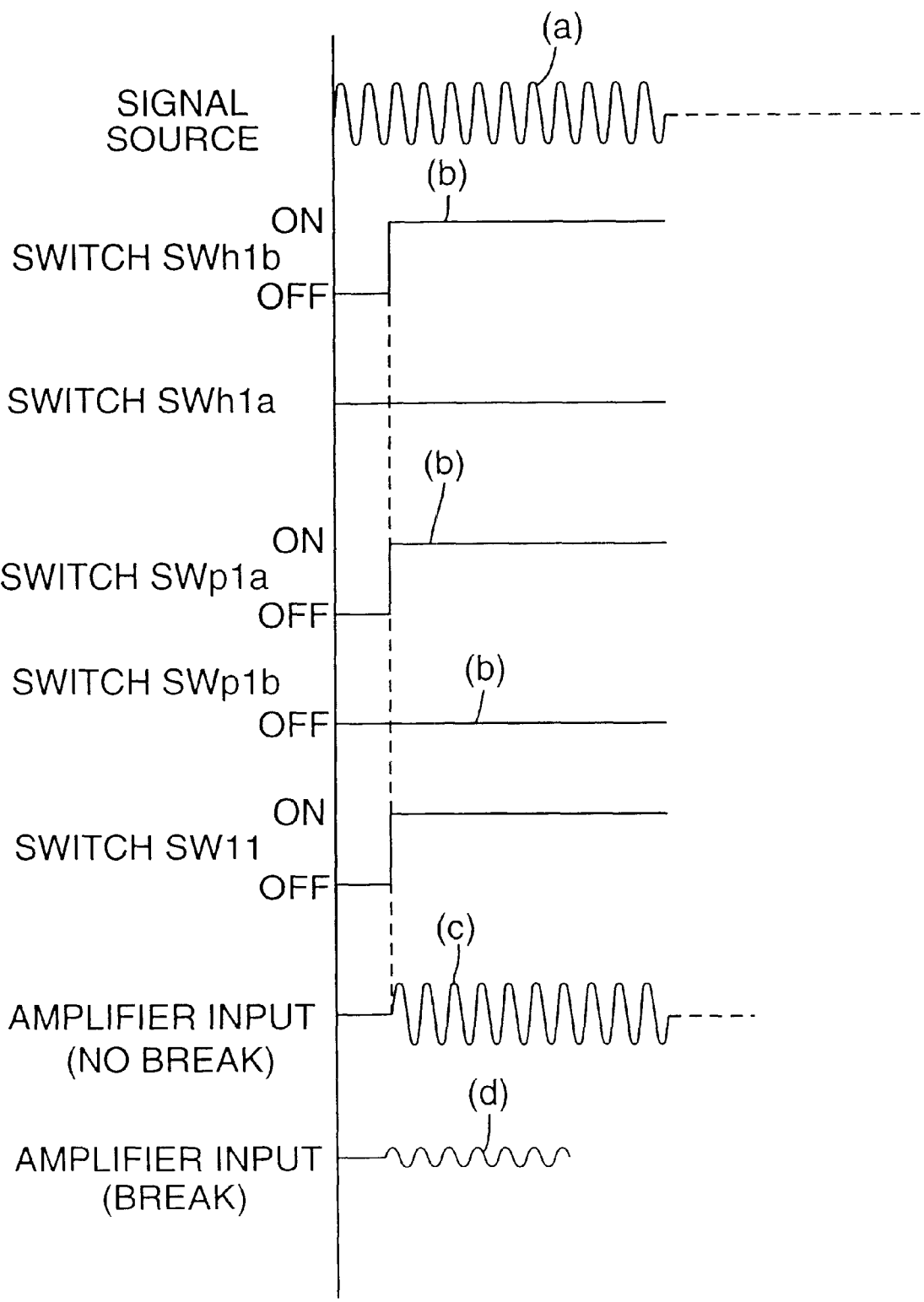
FIG. 10 is a timing chart for the sinusoidal wave AC measuring circuit.

In this case, computer 44 sends a sinusoidal wave (see FIG. 10, ($a$)) generated at the signal source 46 to the printed pattern to be tested by switching over each switch of the switch sections SWp and SWh (see FIG. 10, ($b$)). As shown in FIG. 10, the computer 44 also tests each printed pattern for continuity based on data obtained through signal detecting section 48.

When a specific printed pattern is free of wire breakage, the input voltage Vx to the amplifier 74 will show a normal value as shown in FIG. 10, ($c$). On the other hand if the printed pattern has wire breakage; the input voltage Vx to the amplifier 74 will be of a smaller value as shown in FIG.

10, (d). In other words, when the printed pattern is an open-circuit, the input level will be extremely small, thus making it quite easy to determine discontinuity.

When using an AC signal as described, one should not expect faster testing as in the embodiment in which a signal with rapid change is used. However, employing an AC signal does allow apparatus to be configured using a sinusoidal wave oscillator and a wave detection circuit of a type commonly utilized in non-contact test apparatus. Thus, one can expect a shorter delivery time as well as a reduction in apparatus design and production cost.

Further, in the FIG. 8 embodiment a constant-voltage source is used as a signal source 46 (see FIG. 8, (a)), and a DC voltage supplied from the signal source is configured so that a step-like test signal with a sharp rising edge is obtained by turning each switch on and off (see FIG. 8, (c)). A signal generator that sequentially generates signals having rapid changes may also be used as a signal source 46.

Figure 11:
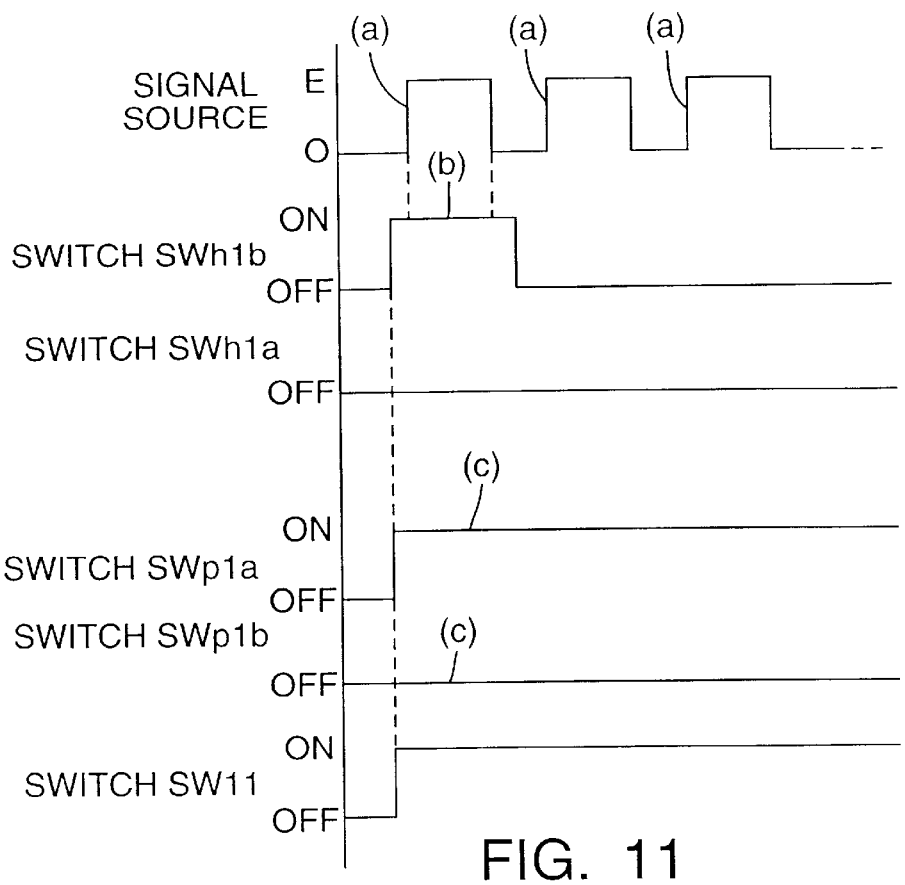
FIG. 11 shows a timing chart for signal processing according to yet another example.

FIG. 11 shows a timing chart for signal processing executed when such a signal source 46 as mentioned above is used. In this example a rectangular wave generation circuit is used as the signal source 46. The computer 44 may distribute to each printed pattern 34a, 34b, . . . (see FIG. 1) each rectangular wave signal that is sequentially generated by the signal source 46, by switching over each switch of the switch sections SWp and SWh (see FIG. 11(b), (c)) almost in synchronization with the phase of the rising edge of each rectangular signal generated by the signal source 46 (see FIG. 11(a)). The input voltage Vx to the amplifier 74 and the processing after the input to the amplifier 74 are the same as in the example shown in FIG. 7.

Figure 12A:
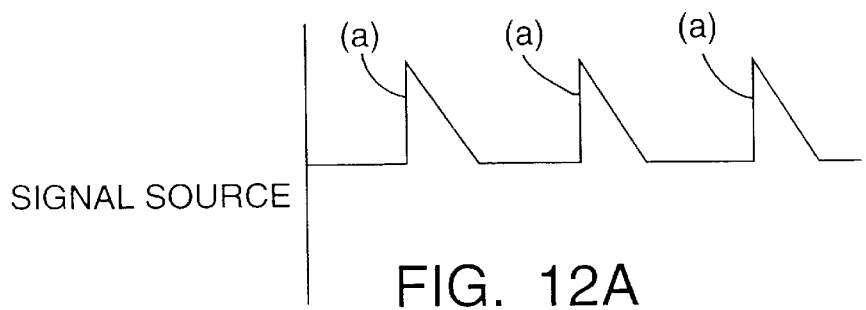
FIG. 12 shows yet another embodiment of signal shapes.
Figure 12B:
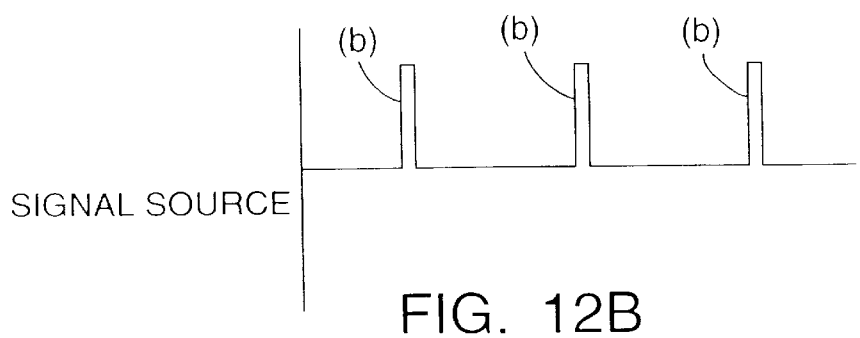

The signal source 46 may also be configured to generate a triangular wave as shown in FIG. 12A. In FIG. 12A each triangular signal has a sharp rising edge (a). In FIG. 12B the signal source 46 generates a pulse train. Similarly to FIG. 12A, each pulse signal has a sharp rising edge (b).

As is well known, signals with sharp rising edges are not limited to those described above. In addition, signals rising and/or falling over a limited period of time as well as those having a sharp falling edge are included.

Figure 13:
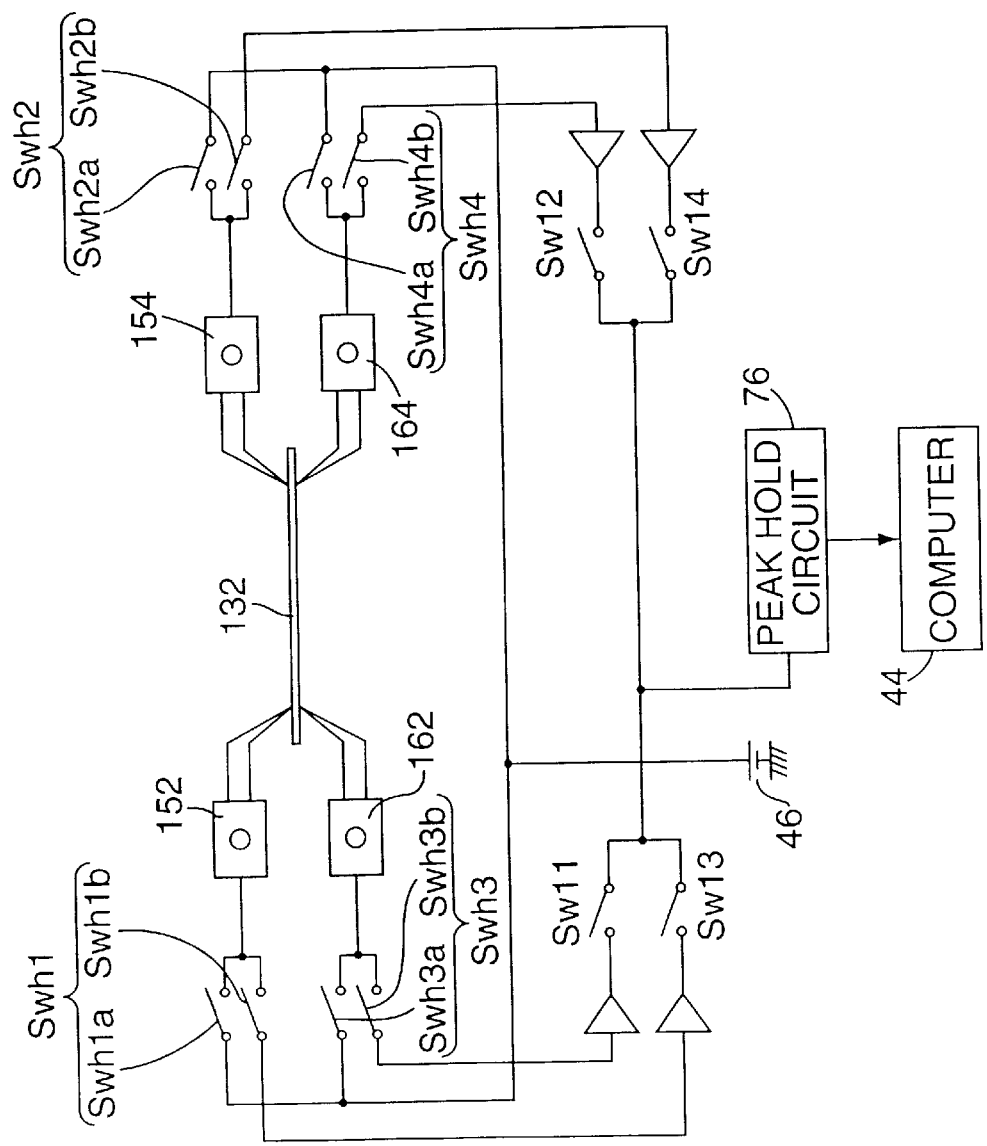
FIG. 13 shows still another embodiment.

Finally, an embodiment having heads 52, 54 on a single surface of a circuit board has been described above. However, a circuit board 132, shown in FIG. 13, with both surfaces carrying finely pitched pads may be continuity tested by using a testing apparatus 100 which has heads 152, 154, 162, 164 on both surfaces of the board.

Said embodiment is configured to test the wiring for continuity, based on the maximum current generated at the first terminal after a rapid change occurs in the signal. The present invention, however, is not limited in this respect. The embodiment may also be configured to test wiring for continuity based on, for example, a quantity relating to the current that is generated between the first terminal and one end of the wiring when a signal with a rapid change is supplied to the other end of the wiring; said quantities including the average value within a specified time of the current generated between the first terminal and one end of the wiring, the current value after the specified time, the steady-state deviation current and the integral value of the current flowing between the first terminal and one end of the wiring after the signal has had a rapid change. However, configuring the present invention to test the wiring for continuity based on maximum current allows a continuity test to be performed in a shorter period of time.

Further, some or all of the functions of the computer 44 shown in FIG. 1 may be realized using hardwire logic. Still further, some or all of the functions of the signal source 46 or the signal detecting section 48 may be realized using the computer.

Additionally, in said embodiment a second terminal is configured to be coupled to the other end of wiring to be tested by means of electrostatic capacity. As a result, a highly reliable test may be carried out using a simple configuration.

Further, in said embodiment the first terminal is configured to be connected to one end of the wiring to be tested, and may also be configured to be coupled to one end of the wiring, for example, by electrostatic capacity.

Further, said embodiment has been described in conjunction with the circuit board to be tested, which has a plurality of other ends mutually connected. However, the present invention is not limited to testing such a circuit board.

Further, although said embodiment has been described in conjunction with a bare board tester, the present invention is not limited to a bare board tester, and may be applied to printed circuit board testing apparatuses in general as well as the printed circuit board test methods in general, including those testing apparatus for circuit boards on which CPUs and other circuit elements are mounted, as well as packages used to mount circuit elements.

Finally, by providing a signal source that generates a DC signal and switching the first switching means sequentially, the embodiment may be configured to obtain a signal having rapid change from the DC signal generated by the signal source, and also to sequentially determine the wiring specified by said first terminal selected, for continuity using said obtained signal.

We claim:

1. A printed circuit board testing apparatus for testing conductivity of a plurality of wirings on a printed circuit board during a testing operation, each of the wirings having a first test point and a second test point, said apparatus comprising:

a plurality of contact probes to be respectively in contact with the first test points of the wirings;

a moving probe having a head;

an insulating sheet to be temporarily placed on the printed circuit board during the testing operation and to be removed from the printed circuit board after the testing operation, the insulating sheet to extend over the second test points of the wirings, said moving probe being in sliding contact with the insulating sheet with its head slidably moving on the insulating sheet;

a movement controller for controlling the movement of the moving probe and positioning the probe head to oppose each of the second test points to form a capacitive coupling between the moving probe and the second test point;

a test signal generator for generating a test signal changing its electric parameter rapidly and for selectively supplying the test signal to each of the contact probes;

a detector for detecting the test signal received by the moving probe through the capacitive coupling; and a comparator for comparing the detected test signal with predetermined data and determining whether the wiring under test is in good conductivity or not.

2. A printed circuit board testing apparatus according to claim 1, wherein the thickness of the insulating sheet is less than a distance through which the test signal can transmit therethrough with enough level for the comparison.

3. A printed circuit board testing apparatus according to claim 1, wherein the insulating sheet has an easily slidable surface on which the moving head slides.

4. A printed circuit board testing apparatus according to claim 1, wherein the test signal generator includes a constant voltage source and a switch for selectively connecting one of the contact probes to the constant voltage source wherein the change of the electric parameter occurs upon connection of a contact probe with a constant voltage source through the switch.

5. A printed circuit board testing apparatus according to claim 1, wherein the wirings are formed on both sides of the printed circuit board, the first test points being located on the lower side of the board and the second test points being located on the upper side of the board, and the contact probes being arranged to be brought into contact with the first test points from underneath the board.

6. A printed circuit board testing apparatus according to claim 5, wherein the printed circuit board has a first group of second test points and a second group of second test points, and the apparatus further includes a first moving probe to be selectively capacitively coupled with the first group of second test points, and a second moving probe to be selectively capacitively coupled with the second group of second test points.

7. A printed circuit board testing apparatus according to claim 6, wherein the printed circuit board has a first group of first test points and second group of first test points, and the apparatus further includes a first group of contact probes to be respectively in contact with the first group of first test points, a second group of contact probes to be respectively in contact with the second group of first test points, and a switch assembly for forming a test circuit for the testing of continuity and/or short circuit of the wirings by selectively incorporating in the test circuit the first and second moving probes and first and second groups of contact probes.

8. A printed circuit testing apparatus for testing electric conductivity of a plurality of wirings formed on a substrate during a testing operation, each wiring having two test points, the apparatus comprising:
    an electrically insulating sheet covering over the other test points during the testing operation and to be removed from covering over the other test points after the testing operation,
    a pair of moving probes sliding on the sheet with the gap being defined by the thickness of the sheet, being positioned just above respective test points;
    a test signal supplier for supplying a test signal to one of the moving probes, said test signal changing its electric parameter to be transmitted through the gap;
    a detector for detecting the test signal through the other of the moving probes; and
    a conductivity determining section for determining conductivity between the one test point above which one of the moving probes is located, and the other test point to which the test signal is being supplied.

9. A printed circuit testing apparatus according to claim 8, wherein one of the pair of moving probes is positioned above one of the two test points of a wiring and the other of the pair of moving probes is positioned above one of the two test points of another wiring to test short circuit between the wirings.

10. A printed circuit board testing apparatus according to claim 8, wherein the signal supplier includes a constant voltage power source and a switch for selectively connecting the power source to one of the moving probes, said test signal being the application of the constant voltage, and said detector reading the test signal through a capacitive coupling between the moving probe and the other test point.

11. A printed circuit testing apparatus according to claim 8, wherein the pair of moving probes are respectively positioned above the two test points of a wiring.

12. A printed circuit board testing apparatus for testing conductivity of a plurality of wirings during a testing operation, each wiring having two test points on a surface of the printed circuit board, the apparatus having a pair of moving probes to be connected through respective capacitive couplings with the test points of each wiring to be tested, the apparatus testing conductivity of the wiring between the two test points, the apparatus comprising:
    an insulating sheet which is to be located between the moving probe and the test points on the printed circuit board during the testing operation and to be removed from between the moving probe and the test points on the printed circuit board after the testing operation, the insulating sheet extending over the test points and having a constant thickness;
    the moving probes each having a probe head, the probe heads moving slidably on the surface of the insulating sheet, and
    a movement controller for controlling the movement of the moving probes and positioning the probe heads on the insulating sheet just above the test points.

13. A printed circuit board testing apparatus according to claim 12, wherein the insulating sheet has an easily slidable surface on which the moving head slides.

14. A printed circuit board testing apparatus according to claim 12, wherein the top of each moving probe has an easily slidable characteristic on the insulating sheet.

15. A method of testing conductivity of wirings on a printed circuit board to be tested by means of a test apparatus during a testing operation, each wiring having at least two test points, the test apparatus having first and second moving probes, each moving probe having a probe head, and the test apparatus also having an insulating sheet having a constant thickness to be temporarily placed on the printed circuit board during the testing operation and to be removed from the printed circuit board after the testing operation, the method comprising the steps of:
    covering the test points of the wirings with the insulating sheet;
    moving the probe heads slidably on the insulating sheet;
    positioning the probe heads to oppose test points of a wiring to form capacitive couplings between the respective probe heads and test points;
    generating a test signal which changes its electric parameter rapidly, and supplying the test signal to the first moving probe;
    detecting a response signal received by the second moving probes, wherein the test and response signals are induced through the capacitive couplings through a thickness of the insulating sheet;
    comparing the response signal with predetermined data;
    determining whether the wiring under test is in good conductivity or not depending on a result of the comparison;
    moving the probe heads slidably on the insulating sheet;
    positioning the probe heads to oppose another pair of test points on a second selected wiring;
    generating a second test signal which changes its electric parameter rapidly, and supplying the second test signal to the first moving probe;
    detecting a second response signal received by the second moving probe, wherein the second response signal is induced through the capacitive coupling through a thickness of the insulating sheet;
    comparing the response signal with predetermined data; and determining whether the second wiring under test is in good conductivity or not depending on a result of the comparison.

16. A test probe moving method for a printed circuit board testing apparatus, the apparatus testing conductivity of wirings on a printed circuit board to be tested during a testing operation, each wiring having at least two test points on a surface of the printed circuit board, the apparatus having first and second moving probes to be connected through respective capacitive couplings with the test points of each wiring to be tested, the apparatus testing conductivity of the wiring between the two test points, the apparatus having an insulating sheet which is to be temporarily located between the moving probe and the test points on the printed circuit board during the testing operation and to be removed from between the moving probe and the test points after the testing operation, the insulating sheet extending over the test points and having a constant thickness, the method comprising the steps of:

positioning probe heads of the moving probes just above the test points by moving the heads slidably on the surface of the insulating sheet, to get an electrical connection between the moving probes;

testing conductivity of the first wiring;

moving the probe heads slidably on the insulating sheet to respective test points of a second wiring to be tested;

positioning the heads of the moving probes just above the test points by moving the head slidably on the insulating sheet; and testing conductivity of the second wiring.

* * * * *